(12) United States Patent
Ahmed

(10) Patent No.: US 7,151,913 B2
(45) Date of Patent: Dec. 19, 2006

(54) ELECTROMAGNETIC WAVE TRANSMITTER, RECEIVER AND TRANSCEIVER SYSTEMS, METHODS AND ARTICLES OF MANUFACTURE

(75) Inventor: Walid Khairy Mohamed Ahmed, Tinton Falls, NJ (US)

(73) Assignee: M/A-COM, Inc., Lowell, MA (US)

( * ) Notice: Subject to any disclaimer, the term of this patent is extended or adjusted under 35 U.S.C. 154(b) by 341 days.

(21) Appl. No.: 10/610,440

(22) Filed: Jun. 30, 2003

(65) Prior Publication Data
US 2004/0264583 A1    Dec. 30, 2004

(51) Int. Cl.
*H04B 1/02* (2006.01)
*H04B 1/66* (2006.01)
*H03F 3/38* (2006.01)

(52) U.S. Cl. .............. 455/91; 455/102; 455/108; 455/110; 455/114.3; 455/114.4; 330/10; 330/149

(58) Field of Classification Search ............ 455/114.2, 455/114.3, 114.4, 102, 108, 110, 126, 127.1–127.4, 455/232.1, 234.2, 235.1; 375/295–298, 300, 375/302, 303, 308; 330/10, 136, 149; 332/103, 332/105
See application file for complete search history.

(56) References Cited

U.S. PATENT DOCUMENTS

| | | | |
|---|---|---|---|
| 3,896,395 A | 7/1975 | Cox | 330/53 |
| 5,056,109 A | 10/1991 | Gilhousen et al. | 375/1 |
| 5,066,923 A * | 11/1991 | Gailus et al. | 330/107 |
| 5,249,201 A | 9/1993 | Posner et al. | 375/59 |
| 5,257,283 A | 10/1993 | Gilhousen et al. | 375/1 |
| 5,265,119 A | 11/1993 | Gilhousen et al. | 375/1 |
| 5,267,262 A | 11/1993 | Wheatley, III | 375/1 |
| 5,396,516 A | 3/1995 | Padovani et al. | 375/225 |
| 5,420,536 A * | 5/1995 | Faulkner et al. | 330/149 |
| 5,452,473 A | 9/1995 | Weiland et al. | 455/88 |
| 5,485,486 A | 1/1996 | Gilhousen et al. | 375/205 |
| 5,507,017 A * | 4/1996 | Whitmarsh et al. | 455/126 |
| 5,590,408 A | 12/1996 | Weiland et al. | 455/69 |
| 5,655,220 A | 8/1997 | Weiland et al. | 455/69 |
| 5,661,434 A | 8/1997 | Brozovich et al. | 330/51 |
| 5,703,902 A | 12/1997 | Ziv et al. | 375/200 |
| 5,757,858 A * | 5/1998 | Black et al. | 375/295 |
| 5,758,269 A | 5/1998 | Wu | 455/127 |
| 5,861,773 A * | 1/1999 | Meyer | 329/304 |
| 5,894,496 A * | 4/1999 | Jones | 455/126 |
| 5,901,346 A * | 5/1999 | Stengel et al. | 455/126 |
| 5,903,554 A | 5/1999 | Saints | 370/342 |
| 5,974,041 A | 10/1999 | Kornfeld et al. | 370/342 |
| 6,011,437 A | 1/2000 | Sutardja et al. | |
| 6,075,974 A | 6/2000 | Saints et al. | 455/69 |
| 6,178,313 B1 | 1/2001 | Mages et al. | 455/127 |
| 6,181,199 B1 * | 1/2001 | Camp et al. | 330/10 |
| 6,185,432 B1 | 2/2001 | Vembu | 455/522 |

(Continued)

FOREIGN PATENT DOCUMENTS

EP     1 035 701     9/2000

(Continued)

*Primary Examiner*—Duc M. Nguyen

(57) ABSTRACT

The invention relates to a system for electromagnetic processing of an input wave involving receiving a modified signal derived from two or more signals that represent the input wave when combined; and regulating the modified signal using at least one characteristic of the two or more signals. Embodiments of the invention may utilize in-phase and quadrature phase signals, where the magnitude portion of the signals may be used for regulating the modified signal. The modified signal may be created by modulating a characteristic of the I, Q signals, such as their sign, with an RF or other frequency carrier wave.

55 Claims, 8 Drawing Sheets

U.S. PATENT DOCUMENTS

| | | | |
|---|---|---|---|
| 6,191,653 B1 | 2/2001 | Camp, Jr. et al. | 330/129 |
| 6,194,963 B1 | 2/2001 | Camp, Jr. et al. | 330/149 |
| 6,259,928 B1 | 7/2001 | Vembu | 455/522 |
| 6,272,336 B1 | 8/2001 | Appel et al. | 455/423 |
| 6,295,442 B1 | 9/2001 | Camp, Jr. et al. | 455/102 |
| 6,308,057 B1 * | 10/2001 | Hayashi | 455/324 |
| 6,313,703 B1 | 11/2001 | Wright et al. | 330/149 |
| 6,320,913 B1 | 11/2001 | Nakayama | 375/297 |
| 6,330,462 B1 | 12/2001 | Chen | 455/572 |
| 6,351,650 B1 | 2/2002 | Lundby et al. | 455/522 |
| 6,370,109 B1 | 4/2002 | Schwartz et al. | 370/203 |
| 6,374,085 B1 | 4/2002 | Saints et al. | 455/69 |
| 6,411,655 B1 * | 6/2002 | Holden et al. | 375/269 |
| 6,421,327 B1 | 7/2002 | Lundby et al. | 370/310 |
| 6,438,360 B1 * | 8/2002 | Alberth et al. | 455/110 |
| 6,449,465 B1 * | 9/2002 | Gailus et al. | 455/126 |
| 6,466,628 B1 * | 10/2002 | Kim | 375/297 |
| 6,490,460 B1 | 12/2002 | Soliman | 455/522 |
| 6,628,165 B1 | 9/2003 | Henderson et al. | 330/85 |
| 6,690,233 B1 * | 2/2004 | Sander | 330/124 R |
| 6,701,134 B1 | 3/2004 | Epperson | 455/102 |
| 6,714,071 B1 * | 3/2004 | Page | 330/136 |
| 6,870,435 B1 * | 3/2005 | Ahmed | 332/103 |
| 6,914,943 B1 * | 7/2005 | Shimizu | 375/302 |
| 6,973,394 B1 | 12/2005 | Jaeger et al. | |
| 2002/0196864 A1 * | 12/2002 | Booth et al. | 375/296 |
| 2003/0073419 A1 | 4/2003 | Chadwick | 455/126 |
| 2003/0223510 A1 | 12/2003 | Kurakami et al. | 375/297 |
| 2004/0192369 A1 | 9/2004 | Nilsson | 455/522 |
| 2004/0266359 A1 * | 12/2004 | Ahmed | 455/67.14 |
| 2005/0030104 A1 | 2/2005 | Chen | 330/295 |
| 2005/0226340 A1 | 10/2005 | Ahmed | 375/259 |

FOREIGN PATENT DOCUMENTS

| | | |
|---|---|---|
| EP | 1 170 915 | 1/2002 |
| GB | 2 363 535 | 12/2001 |
| WO | WO 94/24759 | 10/1994 |
| WO | WO 00/41371 | 7/2000 |

* cited by examiner

ELECTROMAGNETIC WAVE TRANSMITTER, RECEIVER AND TRANSCEIVER SYSTEMS, METHODS AND ARTICLES OF MANUFACTURE

FIELD OF THE INVENTION

The present invention relates to the transfer of electromagnetic waves. More particularly, the present invention relates to a system for processing electromagnetic signals.

BACKGROUND OF THE INVENTION

Electromagnetic waves may be transferred from place to place through a conductor. In wired transmission, the conductor is usually a wire or other solid substance. In wireless transmission, the conductor is usually an ambient substance, such as air, water, etc. In wireless connections a transmitter is usually used to transfer a wave and a receiver to receive a wave. A transceiver combines the functions of both transmitter and receiver in one system. A transmitter typically converts electrical energy into a signal, which is then broadcast via an antenna to a receiver's antenna. Repeaters, middle stations, etc. may be used as intermediates in the transmission to sustain the integrity of the transmitted wave.

The electrical energy input into a transmitter usually is modulated into a basic transmission or carrier signal by overlaying some intelligence upon the energy—speech, data, etc.—in the form of an information signal, and the receiver typically demodulates the modulated carrier signal, once received, into a copy of the initial intelligence sent by the transmitter.

In order to accomplish their function, transmitters and receivers are comprised of various building block components. The information signal, for example, may be generated or modulated by one or more transducers, such as a microphone. It may also be generated by a modulator, such as an analog modem. The modulation of the information signal onto the carrier signal may be done by a mixer and the energy or carrier wave itself is usually generated by an oscillator. An amplifier is usually used at one or more places in the transmitter circuitry to boost the signal strength, to provide power to active components, etc. Similarly, one or more filters are usually used as well, to clean up the input signal, the outputted signal, etc. An antenna is used to broadcast the signal, and a power supply will supply power as needed.

The components of a receiver are similar, and indeed, as noted above, transceivers combine both transmitters and receivers. In a transceiver, separate components may be used for the transmitter and receiver, or, one or more devices providing for switching are used to turn on respective transmitter and receiver components as needed.

Various techniques may be used to actually transfer the intelligence. For example, electromagnetic waves representing the information signal in wireless transmission may be modulated into carrier signals by varying wave characteristics such as amplitude, frequency and phase, in an analog manner.

Transmitters, receivers, and transceiver for modulating waves have been implemented in a number of ways. For example, analog and digital based systems have been used to processed, or modulate, some aspect of the electromagnetic wave, such amplitude, frequency, and/or phase with a carrier wave. Some of these modulation schemes include, for example, GMSK used in GSM, GFSK used in DECT and Bluetooth, 8-PSK used in EDGE, OQPSK and HPSK used in IS-2000, π/4 DQPSK used in TDMA and OFDM used in 802.11.

In many of these modulations schemes, the intelligence, or baseband signal, is processed into a plurality of signal in quadrature with each other. The in-phase (I) and quadrature phase (Q) signals combined represent the original baseband signal. Modulating these baseband components signals provides benefits over other modulation systems in terms of the amount of energy required to transmit a given amount of information (e.g, bits), bandwidth requirements, and a reduced probability of error in the received signal.

Because of drawbacks in conventional systems, however, it would be desirable to provide more efficient and precise transmitter, receiver and transceiver systems, methods and articles of manufacture.

SUMMARY OF THE INVENTION

The invention comprises systems, methods and articles of manufacture for transmitting and receiving electromagnetic waves and signals. Embodiments of the invention may include a method for electromagnetic processing of an input wave involving receiving a modified signal derived from two or more signals that represent the input wave when combined; and regulating the modified signal using at least one characteristic of the two or more signals.

Embodiments of the invention may also include an apparatus for electromagnetic processing of an input wave having an amplifier with at least one amplifying segment for receiving a modified signal derived from two or more signals that represent the input wave when combined; and a control circuit for regulating the modified signal across the amplifying segment using a characteristic of the two or more signals.

Embodiments of the invention may utilize in-phase and quadrature phase signals, where the magnitude portion of the signals may be used for regulating the modified signal. The modified signal may be created by modulating a characteristic of the I, Q signals, such as their sign, with an RF or other frequency carrier wave.

BRIEF DESCRIPTION OF THE DRAWINGS

For the purpose of illustrating the invention, there is shown in the drawings at least one embodiment, which is presently preferred; it being understood, however, that this invention is not limited to the precise arrangements, methods and instrumentalities shown.

DETAILED DESCRIPTION OF THE INVENTION

Figure 1A:
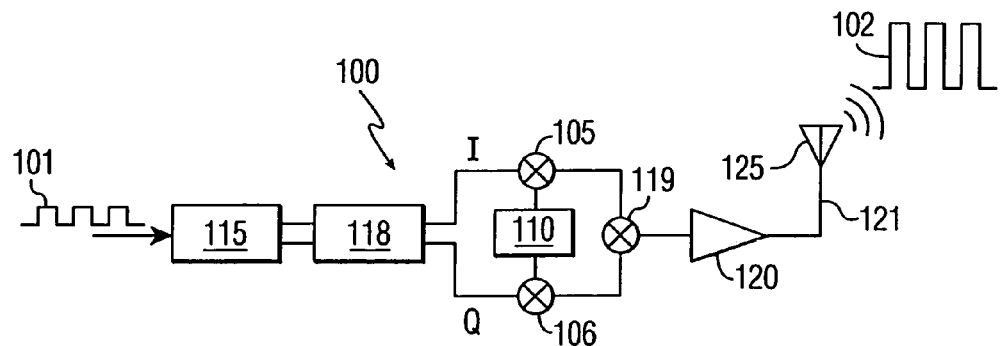
FIG. 1(a) shows a general block diagram of a transmitter incorporating I, Q based modulation.

Embodiments of the present invention include apparatus, methods and articles of manufacture for transmitting and receiving electromagnetic waves and signals. Embodiments of the invention may be entirely comprised of hardware, software and/or may be a combination of software and hardware. Accordingly, individual blocks and combinations of blocks in the drawings support combinations of means for performing the specified functions and/or combinations of steps for performing the specified functions. Each of the blocks of the drawings, and combinations of blocks of the drawings, may be embodied in many different ways, as is well known to those of skill in the art.

This may be accomplished, in one embodiment, by utilizing quadrature, or Cartesian, based modulation of a segmented amplifier (SA), in which baseband I and Q data signals may be applied directly to the SA. Similar to other types of modulation, like polar-based modulation, embodiments of the invention may also utilize a constant envelope RF signal in power amplification by applying digital I and Q signals directly to the segments of the SA.

FIG. 1(a) shows one embodiment of a general transmitter 100 for receiving an input wave 101 and transmitting an output signal 102 using a quadrature based modulation scheme. While described herein in terms of a transmitter, those of ordinary skill in the art will appreciate that the invention may also be used for receivers, transceivers, and other wave processing systems as well.

Turning to FIG. 1(a), an input wave 101 may consist of varying types of intelligence, e.g., voice, data, etc. The input wave 101 may be analog or digital, and is not limited. Similarly the transmitted output signal 102 may consist of various types of intelligence modulated onto a carrier wave, e.g. voice, data, etc. While the output signal may be analog, a digital output signal may be constructed as well and the invention is not limited.

It should be noted that the word "signal" is used herein to describe an electromagnetic wave that has been modulated in some fashion, usually by the impression of intelligence upon the wave, for example imposing data upon a carrier wave. It should also be noted that the use of "signal" and "wave" in the singular includes the plural (or multiple signals and waves respectively) as often transmitters, receivers and transceivers generate more than one signal and/or wave in the normal course of their operation. For example, multiple harmonics of the baseband might be desirably generated as in amplitude modulation; multiple frequencies might be generated, etc. It should also be noted that embodiments of the invention might be used as well to input and/or output waves, as well as signals, as is further described below.

Transmitter 100 may comprise a baseband processor 115, signal processor 118, mixers 105 and 106, a carrier wave source 110, a combiner 119, an amplifier system 120, load line 121, and an antenna 125. A baseband input wave 101 may be inputted into baseband processor 115, which may generate I and Q data signals (analog or digital) representative of input wave 101. A signal processor 118 may be used to further process the I and Q signals, such as correcting the signals for non-linearities produced in power amplifier 120 or to filter unwanted frequency components from the signal. The I and Q signals may then pass to mixer 105 and 106 along separate channels I and Q respectively. Each of the I and Q data signals may then be mixed with a carrier wave generated by carrier wave source 110. The signal may then be recombined at combiner 119 and fed into amplifier 120. Amplifier system 120 may be used to drive antenna 125 through load line 121 using the recombined modulated carrier signal, from which the output signal 102 may be transmitted. Output signal 102 may represent an amplified version of input wave 101, modulated onto the carrier wave provided by carrier wave source 110.

Figure 1B:
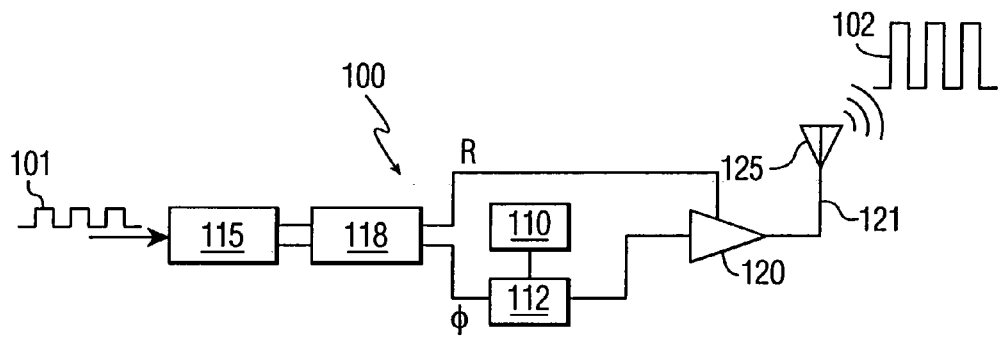
FIG. 1(b) shows a general block diagram of a transmitter incorporating polar based modulation.

FIG. 1(b) illustrates one embodiment of a general transmitter used to receive an input wave 101 and generate an output signal using a polar based modulation scheme. In the embodiment shown in FIG. 1(b), input wave 101 may be received by baseband processor 115, which generate signals representing the amplitude (R) and phase ($\phi$) of input wave 101, which may be analog or digital signals. The phase portion of the signal, $\phi$, may then be passed to a modulator 112, where it is used to modulate a carrier wave from carrier wave source 110.

This modulated carrier signal, which typically has a substantially constant envelope, may then be inputted to amplifier system 120. The gain or level of amplification of the modulated carrier wave signal by amplifier system 120 may be controlled by the amplitude signal (R) in order to use amplifier system 120 to drive antenna 125 through load line 121 with an output signal 102, which is an amplified version of input wave 101 modulated onto the carrier wave. This may be accomplished, for example, by using individual bits of a digital word representing the amplitude portion of input wave 101 to control individual power amplifiers or segments within amplifier system 120, each of which receives the modulated carrier wave signal.

Figure 1C:
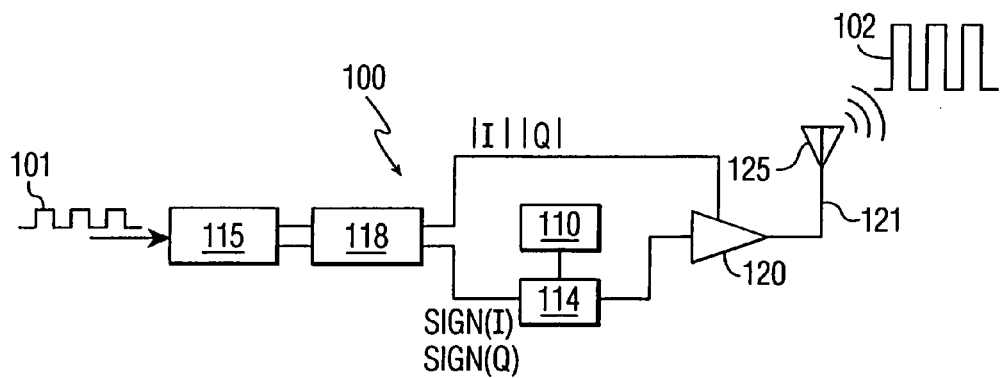
FIG. 1(c) shows a general block diagram of a transmitter incorporating aspects of the invention.

FIG. 1(c) illustrates one embodiment of a general transmitter that may be used to generate an output signal using the system of the invention. In the embodiment shown in FIG. 1(c), an input wave 101 may be received by baseband processor 115, where it may be converted into two or more signals, which, when combined represent input wave 101. In this example, I and Q data signals will be used. Those of ordinary skill in the art will appreciate, however, that the invention is not limited thereto.

As with the previously described embodiments, additional signal processing may or may not be performed by signal processor 118. Thereafter, a signal containing a characteristic of the signals representing input wave 101, such as the sign of an I signal and a Q signal, may be passed to a modulator 114, where this aspect of the signals representing input wave 101 may be used to modulate a carrier wave from a carrier wave source 110 to produce one or more modulated carrier wave signals.

The modulated carrier wave signal(s) may then be passed to amplifier system 120. It would be advantageous for modulated carrier wave signal(s) to have a substantially constant envelope in order to utilize non-linear amplification systems in amplifier 120. Those of ordinary skill in the art will appreciate that the amplifier may comprise any components or circuitry capable of amplifying an electromagnetic wave, such as one or more power amplifiers or transistor segments forming an SA, etc.

Another characteristic of the signals representing input wave 101, such as the magnitude of an signal (|I|) and a Q signal (|Q|), may be passed to amplifier 120 to control the gain or amplification of the modulated carrier wave signal(s). Examples ways to accomplish this are described in more detail below. Amplifier 120 may thus be used to drive antenna 125 through load line 121 with an output signal 102 that is an amplified version of input wave 101 modulated onto a carrier wave signal.

Figure 2:
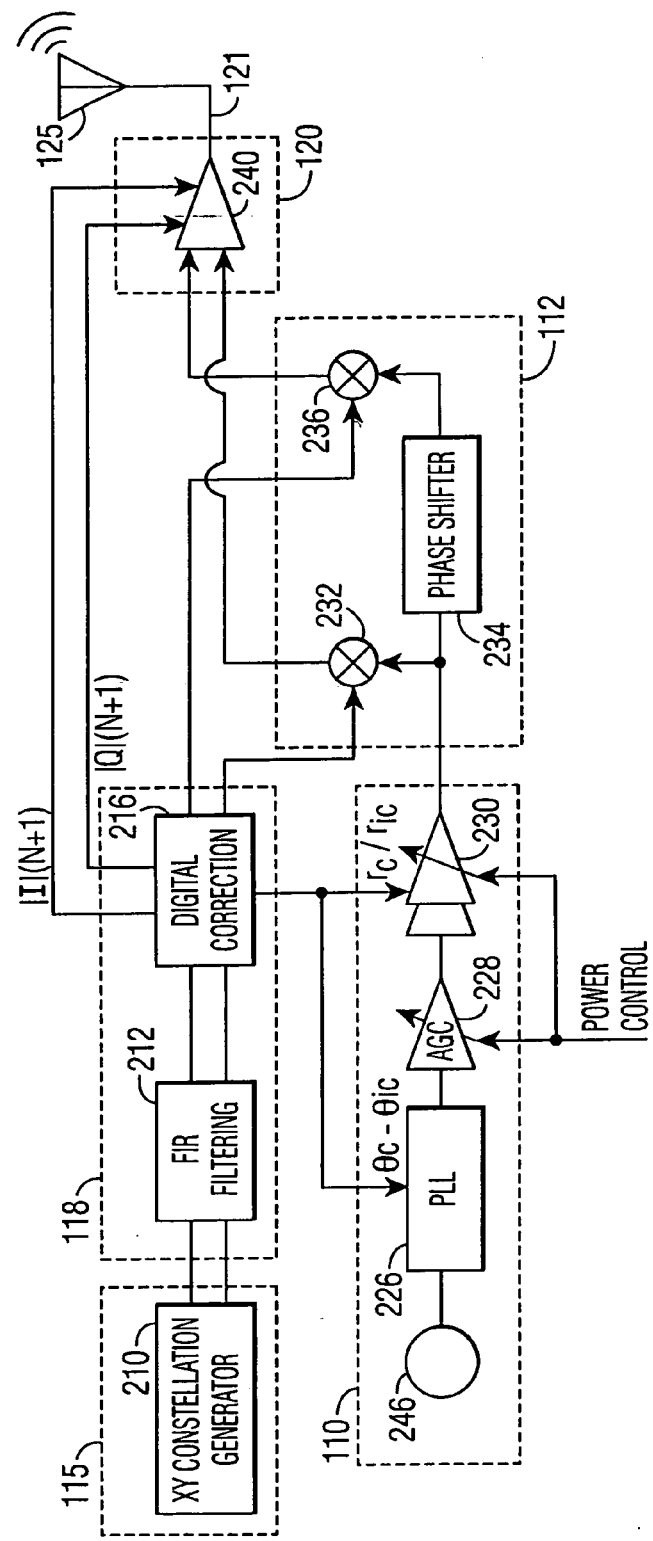
FIG. 2 shows a transmitter embodiment.

A further embodiment is shown in FIG. 2. As shown in FIG. 2, baseband processor 115 may include a controller 210 (e.g., an XY constellation generator) that may receive an input wave and generate two or more signals representing the input wave, such as I and Q data signals. Controller 210 is not limited, but may comprise a digital signal processor in this embodiment, having an analog to digital converter that may digitize the wave into rectangular coordinates of I and Q data signals.

These I, Q characteristics of the original input wave may be modulated into digital pulses comprising a digital word quantized into bits B1 to Bn, with a Most Significant Bit ("MSB") to Least Significant Bit ("LSB"). The digital word may be of varying lengths in various embodiments. In general, the longer the word the greater the accuracy of reproduction of the input wave by the system (i.e, its resolution). Of course, in other embodiments, a differently composed digital word or an analog signal may be used.

The signals representing the input wave may then be transmitted through separate paths or channels to amplifier system 120. For example, I and Q data signals may be passed from baseband processor 115 to a signal processor 118. Signal processor 118 may include, for example, filter 212 for filtering out unwanted frequency components to perform shaping of the signal pulses. In one embodiment, filter 212 may use polyphase filter banks that have a configurable number of taps and programmable filter coefficients to support different digital modulation schemes, although not limited thereto. For example, filter 212 may comprise a low-pass filter, such as a finite impulse response (FIR) or an infinite impulse response (IIR) filter. In another embodiment, filter 212 may comprise a low-pass filter bank, which is comprised of a series of filters $F_0$ to $F_{n-}$. The impulse responses of filters $F_0$ to $F_{n-1}$ may be at $h_0(t)$ to $h_{n-1}(t)$ respectively. Alternatively, one impulse response h(t) may be determined based upon the output to be produced at amplifier 120 that is applied to each of the signal bits.

The signals representing the input wave may then be passed through a digital correction system 216 to reduce nonlinearities, such as bowing due to AM/PM distortion, in the resulting signal outputted from amplifier 120. Of course, those of ordinary skill in the art will appreciate that one or more correction circuits may be used.

Digital correction system 216 may comprise, for example, one or more digital signal processors (that may or may not be part of baseband processor 115 also) that contains an algorithm that uses a look-up table (LUT) containing values based upon a linear approximation of the output from amplifier 120 to correct the signals representing the input wave (e.g., I and Q component signals) to help maintain the linearity of the output signal from power amplifier 120.

In one embodiment, for example, the N-bit values of I and Q data signals may be translated into new N-bit values that will linearize the output from power amplifier 120 closer to its desired values. In such a system, a correction table may comprise $2^{N-1}(2^{N+1})$ entries, since values for each of the I and Q data signals would comprise 2N bits in this embodiment. However, those of ordinary skill in the art will appreciate that the actual number of entries may be reduced depending on the characteristics of amplifier 120. The better the characteristics of amplifier 120, the less phase distortion per state, and the more entries that may be segmented into a smaller number of entries.

One way of building the look-up table of digital correction system 216, for example, may be by finding another I, Q output state for each I, Q input state $(s_I, s_Q)$ for which the output voltage $v=v_{real}+jv_{imag}$ minimizes the Euclidean distance $|(s_I+js_Q)-\alpha(v_{real}+jv_{imag})|^2$, where $\alpha$ is an arbitrary constant that may be chosen to optimize the final correction performance.

Digital correction system 216 may be used to make fine phase and amplitude corrections to the carrier wave signal via phase-locked loop (PLL) 226 and gain pre-stage 230 of carrier wave source 110. Correction signals may be computed by digital correction system 216, for example, based upon I and Q signals that it receives, and passed to PLL 226 and gain pre-stage 230. In this embodiment, small phase and amplitude corrections may be made to the reference source ($f_{ref}$) from an oscillator 246 for the carrier wave ($f_{carrier}$) in PLL 226 and to gain pre-stage 230, as shown in FIG. 2. In the example shown in FIG. 2, $\theta_c$ is the determined correct phase of the signal, $\theta_{ic}$ is the incorrect measured phase and the difference $\theta_c-\theta_{ic}$ is the amount of the correction that may be applied to PLL 226. Similarly, in this example, $r_c$ is the correct magnitude for the signal, $r_{ic}$ is the incorrect measured magnitude and the ratio $r_c/r_{ic}$ is the correction amount that may be applied to the carrier wave at gain pre-stage 230.

Correcting the states of both the I and Q data signals has significant benefits, including a greater degree of control as compared with other modulation systems, such as polar based phase modulation schemes. Moreover, in the described embodiment, the output I and Q signals may be linearized as close as possible to the desired output values, and only small amplitude and phase corrections need to be made to the carrier signal. In contrast, in polar based modulation, for example, digital baseband correction is typically one-dimensional, being applied to the amplitude aspect of the input wave, and all of the phase correction must be done in the PLL of a phase modulator. This results in a greater sensitivity of polar based systems to phase error, particularly at higher sampling rates.

The sign portion of each I signal component may be passed to a mixer 232 in modulator 114, where it may be modulated onto a carrier wave produced by oscillator 246 and PLL 226 in carrier wave source 110. Carrier wave oscillator 246 may be any source of electromagnetic waves that is capable of producing a signal wave, such as a voltage-controlled oscillator (VCO). In another embodiment this signal source may be a TCXO. Similarly, the sign portion of a Q signal component may be inputted to a mixer 236 within modulator 114.

The modulated wave outputted from mixers 232 and 236 may each have a substantially constant envelope, i.e., they have no amplitude variations, yet have characteristics of the original input wave. Because the Q data signal is in quadrature with the I data signal, the carrier wave may be phase shifted by ninety degrees using phase shifter 234. Phase shifter 234 may comprise any mechanism capable of shifting the phase of the carrier signal wave, such as through the use of delay lines, waveguide elements, microstrips, etc.

Those of ordinary skill in the art will appreciate that modulator 114 is not limited to the embodiment disclosed herein, but may comprise any circuitry and/or components capable of producing one or more modulated carrier wave signals based upon the inputting of a carrier wave and an aspects of two or more signals that represent the input wave. For example, if a carrier wave of frequency $\omega_c$ is inputted to modulator 114, along with the sign (±) of an I and a Q signal representing the input wave, then modulator 114 may output one or more signals, such as +cos($\omega_c$), −cos($\omega_c$), +sin($\omega_c$), and −sin($\omega_c$). This may be accomplished in the above-described manner or any other.

In one embodiment, a full Ts-Hold sample and hold mechanism may be used to generate an output signal from amplifier 120. In this example, amplifier 120 may include a plurality of segments 240, the outputs from which may be controlled by the magnitude portion of the I and Q data signals 220 and 222. In one embodiment, amplifier 120 may include N segments for the N bits of each of the I and Q data signals, where each segment corresponds to a data control bit from the I and Q signals. In some embodiments the regulation may be of the bias current to transistor segments, as is described further below, and so the control component may be referred to as a bias control circuit, and a number of them as a bias network. In some embodiments, it may be desired to statically or dynamically allocate one or more control circuits to one or more segments.

Figure 3A:
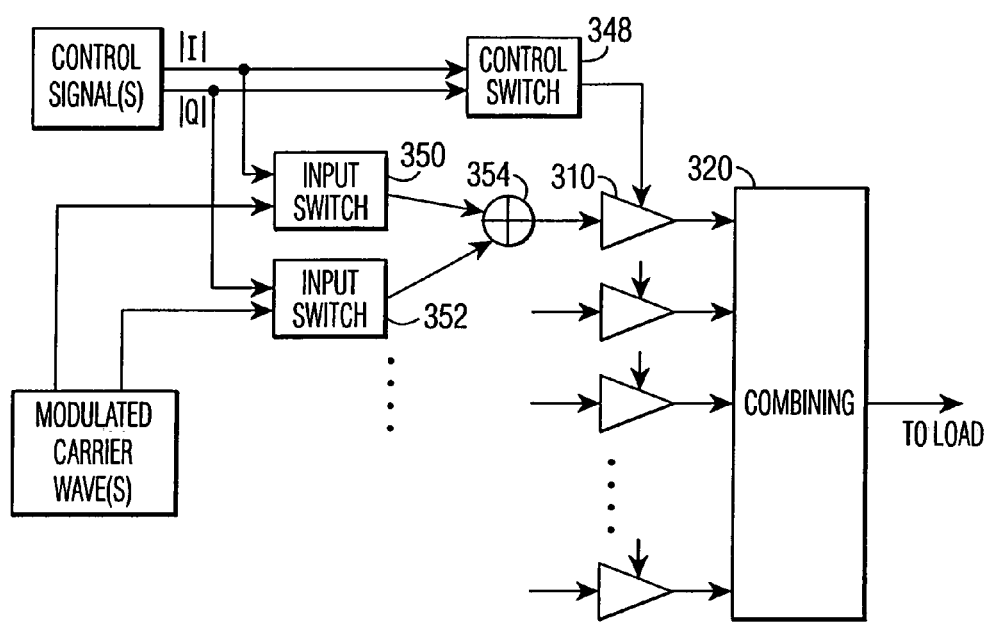
FIG. 3(a) shows an amplifier embodiment.
Figure 3B:
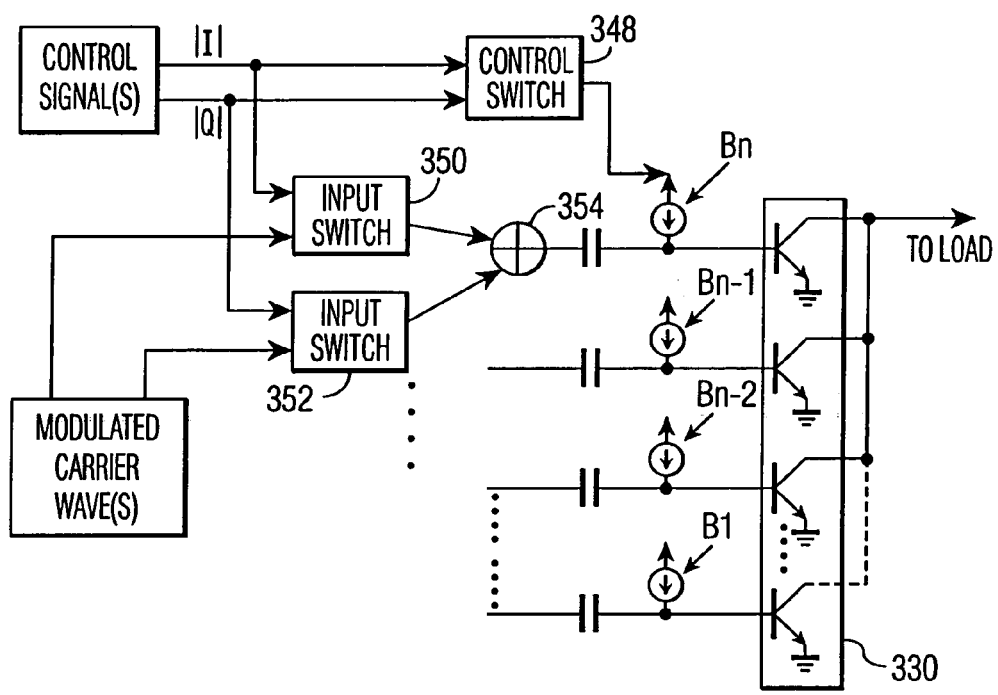
FIG. 3(b) shows another amplifier embodiment.

In the embodiments of an amplifier shown in FIGS. 3(a)–(b), each bit from the magnitude portion of the I data signal may be passed as an input to one or more control switches 348 for each segment, and also to input switches 350 for each amplifying segment. The output from each bit from the magnitude portion of the Q data signal may also be inputted to control switches 348, and into input switches 352 for each segment. The output from mixer 232 (FIG. 2), which may comprise the carrier wave signal modulated by the sign of the I data signal for example, may be inputted to each input switch 350, while the output from mixer 236 maybe inputted to each input switch 352.

When either of a I-bit or the Q-bit corresponding to that segment is 1 (or "on"), input switches 350 and 352 may output the I modulated carrier signal and the Q modulated carrier signal, respectively. The carrier signal output from each input switch 350 and 352 may then be recombined at combiner 354. Combiner 354 may thus output the I modulated carrier signal if the I-bit is 1, the Q modulated carrier signal if the Q-bit is 1, or an I,Q modulated carrier signal if both bits are 1. The signal outputted from combiner 354 may then be inputted to each respective amplifying segment of amplifier 120.

In some embodiments, the output from each control switch 348 and from combiner 354 may be inputted to one or more power amplifiers 310 for generating an output. If a plurality of power amplifiers are used, they may be individually weighted based upon the number of control bits to segments. For example, if the overall gain of amplifier 120 is to be "A", one amplifier may have a gain of A/2, another A/4, etc.

One possible control operation of each segment via control switches 348 and input switches 350, 352 is illustrated in Table 1 below for the example of the A/2 segment discussed above. In this example, control switch 348 is effectively a logical "OR" gate and input switches 350, 352 are essentially logical "AND" gates.

TABLE 1

| I-bit | Q-bit | A/2 Segment Output |
|---|---|---|
| 0 | 0 | No output |
| 0 | 1 | (A/2) * (Q signal) |
| 1 | 0 | (A/2) * (I signal) |
| 1 | 1 | (A/2) * (I, Q signal) |

In the embodiment shown in FIG. 3(a), the output of each power amplifier 310 may then be combined in combining circuit 320, creating an output signal to drive the load. Combining circuit 320 is not particularly limited, and may comprise any mechanism for combining the output from each power amplifier, such as by using power transformers, quarter-wave transmission lines, discrete LC components (e.g., Pi-networks), and the like.

Another embodiment of amplifier 120 is illustrated in FIG. 3(b). In this embodiment, each amplifying segment of transistor 330 may serve as a potential current source. The segment may or may not act as a current source, because it may be regulated via the appropriate signal for regulating that control component control switch 348, and activation of a segment is dependant upon the value of the control signal, and concomitant regulation of the appropriate control component.

Each of the amplifying segments Bn–B1 may act as a current source in this embodiment, although, in other embodiments, other sources of other wave characteristics may be used, as well as other regulation schemes. Segments Bn–B1 may be switched on and off by bits of the digital word output from the amplitude component of each of the I and Q data signals and so regulated thereby. For example, if either the I-bit or the Q-bit from the magnitude data signals are 1 (or "on"), then the corresponding control bit from control switch 348 may be high and the segment may be turned on, contributing a portion of the output current based on the I, Q, or combined I, Q carrier signal inputted from combiner 354. As had been noted above, the length of the digital word may vary, and so the number of bits and control components and transistor segments may vary accordingly in various embodiments. Additionally, embodiments may comprise a single bit length word.

Transistor 330 and its segments may be an HBT transistor. Other transistors may be used as well, such as FET, etc., as well as other current or wave characteristic sources. Other components may be interposed as well, e.g., a driver before transistor 330, a VGA to reduce the drive current to the transistor segments, etc.

In various embodiments, the amplifying segments may vary in size. For example, one segment may be twice the size of the next segment, which in turn may be twice the size of the next segment, and so on until reaching the final segment, so that if the overall gain of amplifier 120 is A, the sum of the gain of all of the segments is A. The largest segment may be controlled, for example, by the MSB for the magnitude of the I and Q signals, the next bit to the next largest segment, etc., until the LSB, which is sent to the smallest segment. Of course, as had been noted above, other embodiments may have a different pattern of matching signal to segment. In other embodiments, other wave characteristics may be fed to another source of wave characteristics and so regulate that source.

Thus, a portion of the signals that represent the input wave, such as the magnitude portion of an I and Q signal, may be used to actuate individual amplifying segments within amplifier 120 to amplify a carrier signal modulated in relation to the original input wave. This produces an output current from amplifier 120 that represents an amplified carrier wave carrying the intelligence contained within the input wave.

Figure 4:
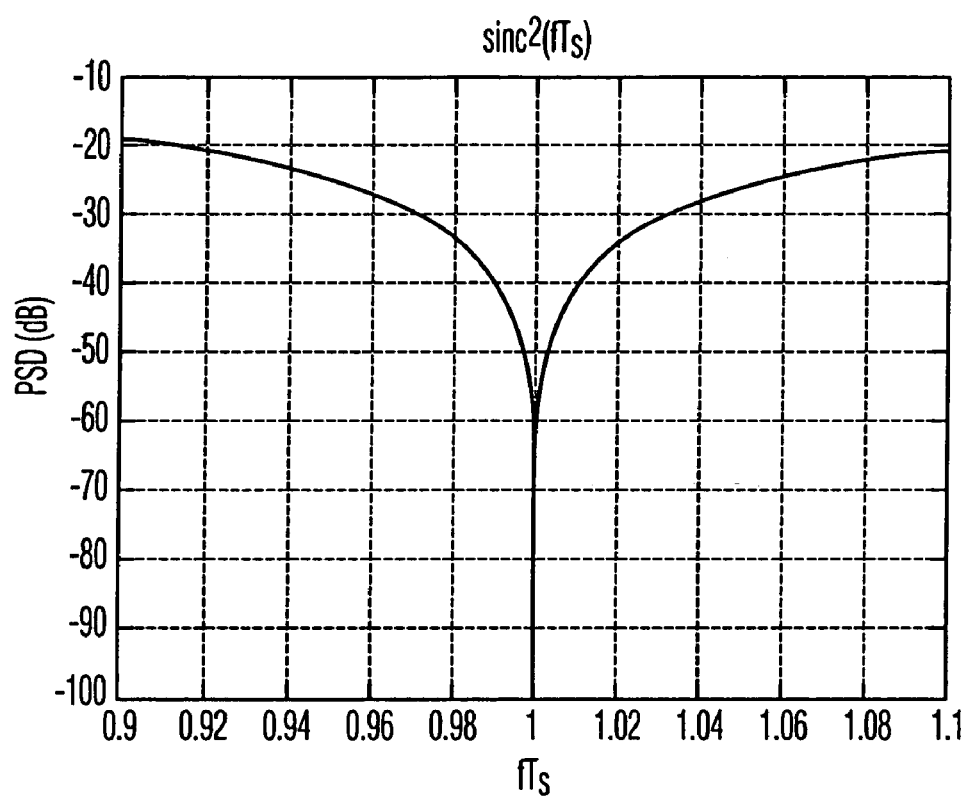
FIG. 4 shows a sampling effect for a full Ts-Hold sample and hold mechanism.

In the embodiments described herein (employing a full Ts-Hold sample and hold mechanism), the frequency spectrum of the output signal may be multiplied by $\text{sinc}^2(fT_s)$ to determine if the output signal satisfies adjacent channel power ratio ("ACPR") requirements. A plot of this is illustrated in FIG. 4. As shown in FIG. 4, a natural null point exists at the image locations, which occur at multiples of the sampling frequency, $f_s$ (which is, of course, $1/T_s$). The ratio of the sampling frequency to the bandwidth of the baseband input wave may provide an indication of how large the peaks of the images may be, and hence whether or not the power amplifier satisfies ACPR requirements. If the ACPR requirements are not satisfied, a higher sampling rate may be used.

Figure 5A:
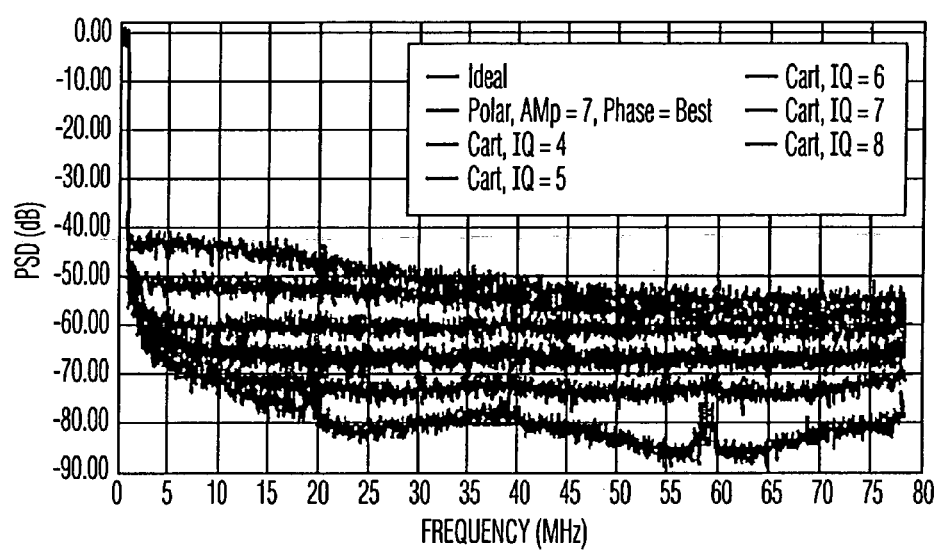
FIGS. 5(a)–(c) show power spectral density versus bit-width for a polar modulator and for a simulated embodiment of the invention.
Figure 5B:
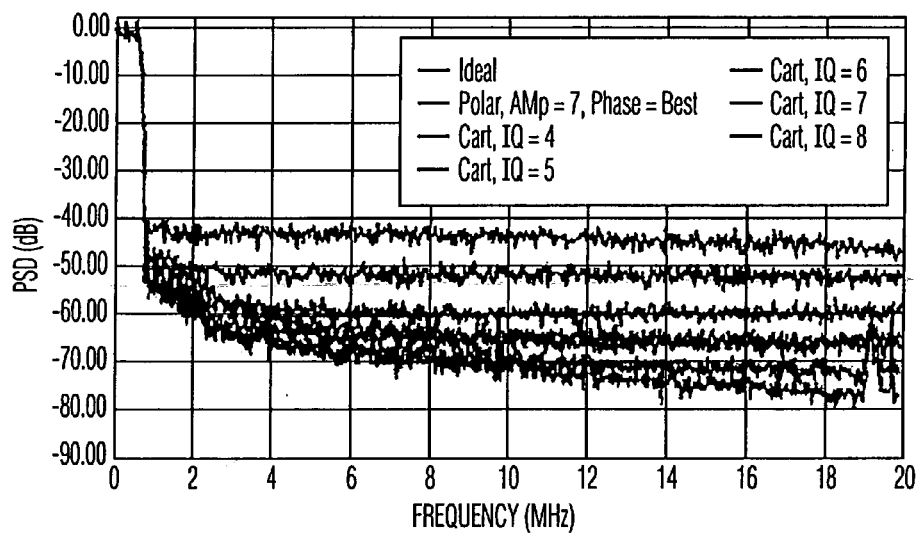
Figure 5C:
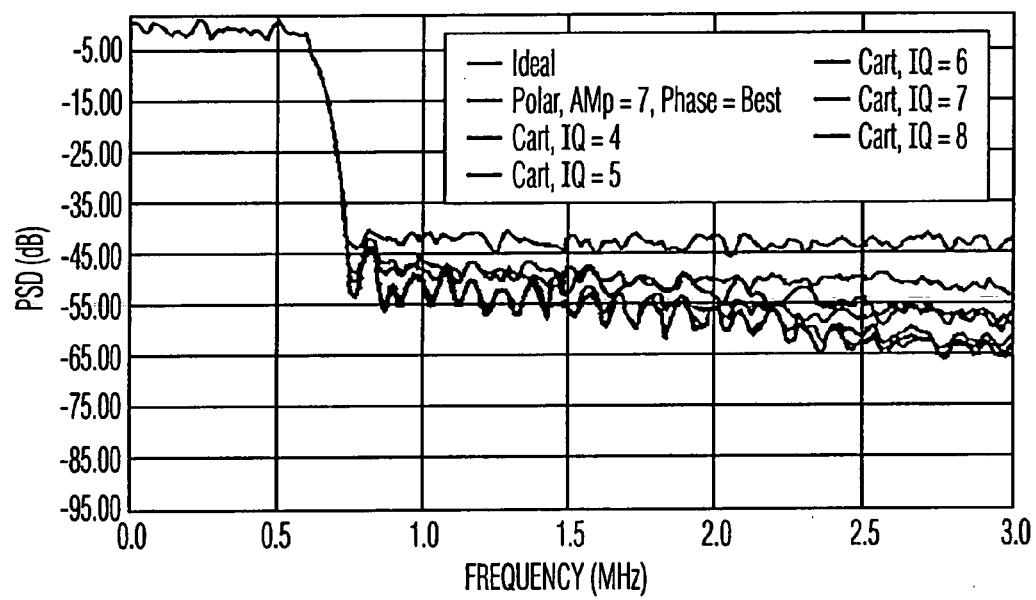

FIGS. 5(a)–(c) contain charts comparing a simulation of the invention against a polar modulation system using power spectral density a reconstructed I-Q signal. As may be seen from FIGS. 5(a)–(c), a 7-bit modulator of the invention outperforms a 7-bit polar modulator for various bit-widths. Moreover, a simulation of the invention using a 5 or 6-bit modulator also outperformed a 7-bit polar modulator at frequencies close to the main-band edge. In the examples shown, the 8-bit modulator of the invention had an ACPR advantage over a 7-bit polar base modulation system of 7.10 dB, a 7-bit modulator had a 6.98 dB advantage, a 6-bit modulator a 5.84 dB advantage, and a 5bit modulator had a 1.51 dB advantage over the 7-bit polar system. Only the 4-bit modulator of the invention showed a disadvantage in ACPR over the polar modulator (−4.43 dB).

It should be noted that transmitter embodiments, as well as receiver and transceiver embodiments, may proceed with various types of antennas, both active and passive. Additionally, it should be noted that an antenna may not be required in some embodiments, e.g. in wired transmitter, receiver, and/or transceiver embodiments.

In the especially preferred embodiments, a transmitter, receiver, and transceiver of the invention may be specialized for particular input waves, carrier waves and output signals, e.g. various types of cell phones, such as CDMA, CDMA2000, W-CDMA, GSM, TDMA, as well as various other types of devices, both wired and wireless, e.g. Bluetooth, 802.11a, -b, -g, GPS, radar, 1×RTT, radios, GPRS, computers and computer communication devices, handheld devices, etc. Among the modulation schemes supported by the invention are: GMSK, which is used in GSM; GFSK, which is used in DECT & Bluetooth; 8-PSK, which is used in EDGE, OQPSK & HPSK, which are used in IS-2000; p/4 DQPSK, which is used in TDMA; and OFDM, which is used in 802.11.

Various embodiments may utilize both analog and digital components insofar as these embodiments manipulate waves and signals requiring both. For example, cell phone embodiments may utilize both analog and digital components. Various types of system architectures may be utilized for constructing the embodiments. For example, an ASIC composition may be used in realizing the various architectures. CMOS and/or BiCMOS fabrication techniques may be used as well as a combination of both, e.g. a BiCMOS Phase modulator area combined with a CMOS baseband area. Generally, in the some embodiments, transistor speed is a concern, and BiCMOS provides faster speed. Additionally, BiCMOS provides less current drain than an all CMOS configuration.

The invention improves over the systems of the prior art. Conventional I/Q modulators have been used with linear modulation schemes and amplifiers. Not using such linear modulation eliminates the problem of I/Q imbalance and distortion that occurs when these systems are used. Using analog modulation of Cartesian I, Q data in the system of the invention also has advantages over other modulation schemes, such as, for example, polar based modulation. The invention eliminates the need for a polar conversion stage and the difficulties associated with the design of a phase modulator module that would be required for interfacing the phase signal to an ASA. In addition, the bandwidth and quantization requirements for the I and Q signals are much smaller than those for the amplitude and phase signals used in polar based modulation.

Power control may be accomplished by varying the input power levels to the power amplifier via a voltage-controlled attenuator, along with the base bias voltages on the buffer and I, Q modulator stages. The modulation function is performed at the final stage in the transmit line-up. This allows for a very efficient solution for the overall transmitter as the modulated RF carrier signal applied to all gain blocks of the transmitter will be constant envelope.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. For example, various filtering components may be added as desired for filtering or processing signals propagating through the system. Various components may be combined or separated, or additional components may be added (such as isolating or gain controlling amplifiers). Accordingly, the foregoing description is by way of example only, and not limiting. The invention is limited only as defined in the following claims and equivalents thereto.

What is claimed is:

1. A method for electromagnetic processing of an input wave comprising the steps of:
   receiving a modified signal derived from two or more signals that represent said input wave when combined, said modified signal being a carrier wave modulated by a characteristic of at least one of said two or more signals that represent said input wave when combined; and
   regulating said modified signal using a comparison of at least one characteristic of one of said two or more signals with said at least one characteristic of another of said two or more signals.

2. A method as in claim 1, wherein said two or more signals are in quadrature with each other.

3. A method as in claim 1, wherein said characteristic used to regulate said modified signal is magnitude.

4. A method as in claim 1, wherein said modified signal is regulated using a digital signal containing said characteristic of said two or more signals that represent said input wave when combined.

5. A method as in claim 1, further comprising the step of generating an output signal from said regulation of said modified signal.

6. A method as in claim 1, wherein said step of regulating said modified signal is performed using a plurality of segments.

7. A method as in claim 6, wherein one or more of said segments is independently controlled as a power amplifier by a portion of said two or more signals that represent said input wave to contribute power to an output signal.

8. A method as in claim 7, further comprising the step of generating an output signal by combining power outputted from one or more of said segments.

9. A method as in claim 8, wherein said step of generating an output signal by combining power is accomplished using one or more selected from the group consisting of power transformers, quarter-wave transmission lines, discrete LC components, and a Pi-network.

10. A method as in claim 7, wherein one or more of said segments is independently controlled as a current source by said portion of said two or more signals that represent said input wave to contribute current to an output signal.

11. A method as in claim 1, wherein said received modified signal contains only one of said two or more signals used to derive said modified signal.

12. A method as in claim 1, wherein said received modified signal is derived from a sign characteristic of at least one of said two or more signals that represent said input wave when combined.

13. A method as in claim 1, further comprising the step of generating said modified signal.

14. A method as in claim 13, wherein said step of generating said modified signal comprises phase shifting a carrier wave to generate a phase shifted carrier wave, mixing a characteristic of one of said two or more signals that represent said input wave when combined with said carrier wave, and mixing a characteristic of another of said two or more signals that represent said input wave when combined with said phase shifted carrier wave.

15. A method as in claim 14, wherein said carrier wave and said phase shifted carrier wave have a relative phase difference of 90°.

16. A method as in claim 1, further comprising the step of generating said two or more signals that represent said input wave when combined.

17. A method as in claim 16, further comprising the step of processing one or more of said two or more signals that represent said input wave when combined.

18. A method as in claim 17, wherein said step of processing comprises one or more selected from the group consisting of performing correction of an amplitude characteristic of a carrier wave used in said derivation of said modified signal, correction of a phase characteristic of a carrier wave used in said derivation of said modified signal, and filtering of one or more of said two or more signals that represent said input wave when combined.

19. A method as in claim 1, wherein said electromagnetic processing of said input wave comprises RF modulation.

20. A method as in claim 1, wherein said step of regulating said modified signal comprises:
  comparing a portion of one of said at least two signals that represent said input wave when combined with at least another of said two signals to generate a digital control signal; and
  regulating said modified signal using said digital control signal.

21. A method for transmitting an input wave comprising the steps of:
  generating two or more digital signals that represent said input wave when combined;
  modulating a carrier wave with at least one characteristic of at least one of said two or more signals to generate a modulated signal;
  modulating a phase shifted carrier wave with a characteristic of another of said two or more signals to generate a phase shifted modulated signal;
  inputting said modulated signal and said phase shifted modulated signal into an amplifier having at least one amplifying segment;
  comparing another characteristic of one or more of said two or more digital signals that represent said input wave when combined with said characteristic of another of said two or more digital signals to generate at least one digital control signal;
  controlling said at least one amplifying segment with said at least one digital control signal to generate at least one segment output; and
  transmitting an output signal based upon said at least one output segment.

22. The method of claim 21, wherein said two or more digital signals comprise an in-phase and a quadrature signal.

23. The method of claim 21, wherein said characteristic used to generate said control signal is magnitude.

24. The method of claim 21, wherein said characteristic used to modulate said carrier wave is sign.

25. The method of claim 21, wherein said carrier wave is an RF signal.

26. The method of claim 21, wherein said segment amplifies power.

27. The method of claim 21, wherein said segment is a current source.

28. An apparatus for electromagnetic processing of an input wave comprising:
  an amplifier having at least one amplifying segment for receiving a modified signal derived from two or more signals that represent said input wave when combined; and a control circuit for regulating said modified signal across said amplifying segment using a comparison of at least one characteristic of one of said two or more signals with said at least one characteristic of at least another of said two or more signals.

29. An apparatus as in claim 28, wherein said two or more signals are in quadrature with each other.

30. An apparatus as in claim 28, wherein said characteristic used to regulate said modified signal is magnitude.

31. An apparatus as in claim 28, wherein said modified signal is regulated using a digital signal containing said characteristic of said two or more signals that represent said input wave when combined.

32. An apparatus as in claim 28, further comprising an output circuit for generating an output signal from said regulation of said modified signal.

33. An apparatus as in claim 28, wherein said amplifier comprises a plurality of segments.

34. An apparatus as in claim 33, wherein one or more of said segments comprises a power amplifier.

35. An apparatus as in claim 34, further comprising a combining circuit for combining an output from one or more of said segments, wherein said combining circuit comprises one or more selected from the group consisting of power transformers, quarter-wave transmission lines, discrete LC components, and a Pi-network.

36. An apparatus as in claim 33, wherein one or more of said segments is a current source that contributes current to an output signal.

37. An apparatus as in claim 28, wherein said received modified signal contains only one of said two or more signals used to derive said modified signal.

38. An apparatus as in claim 28, further comprising:
  a source of a carrier wave;
  a phase shifter for phase shifting said carrier wave to generate a phase shifted carrier wave;
  a mixer for mixing a characteristic of one of said two or more signals that represent said input wave when combined with said carrier wave; and
  another mixer for mixing a characteristic of another of said two or more signals that represent said input wave when combined with said phase shifted carrier wave.

39. An apparatus as in claim 38, wherein said carrier wave is an RF signal.

40. An apparatus as in claim 38, wherein said carrier wave and said phase shifted carrier wave have a relative phase difference of 90°.

41. An apparatus as in claim 28, further comprising a signal generator for generating said two or more signals that represent said input wave when combined.

42. An apparatus as in claim 41, further comprising a signal processor for processing one or more of said two or more signals that represent said input wave when combined.

43. An apparatus as in claim 42, wherein said signal processor is programmed to do one or more selected from the group consisting of performing correction of an amplitude characteristic of a carrier wave used in said derivation of said modified signal, correction of a phase characteristic of a carrier wave used in said derivation of said modified signal, and filtering of one or more of said two or more signals that represent said input wave when combined.

44. An apparatus for electromagnetic processing of an input wave comprising:
   an amplifier having at least one amplifying segment for receiving a modified signal derived from two or more signals that represent said input wave when combined;
   a comparator for comparing said characteristic of at least one of said two or more signals that represent said input wave when combined with said characteristic of at least another of said two or more signals to generate a digital control signal; and
   a control circuit for regulating said modified signal across said at least one amplifying segment using said digital control signal.

45. An apparatus as in claim 44, wherein said characteristics of each of said two or more signals have at least two states that signify on and off, and wherein said comparator comprises a logic circuit that passes an on signal to said amplifying segment if any of said characteristic of said two or more signals is in an on state.

46. An apparatus as in claim 45, further comprising:
   a switching circuit for receiving said characteristic of at least one of said two or more signals that represent said input wave when combined, and a portion of said modified signal derived from said one of said two or more signals, wherein said switching circuit is configured to output said portion of said modified signal if said characteristic of said one signal is in said on state;
   another switching circuit for receiving said characteristic of said another of said two or more signals and another portion of said modified signal derived from said another of said two or more signals, wherein said another switching circuit is configured to output said another portion of said modified signal if said characteristic of said another signal is in said on state; and
   a combiner circuit for combining said output from said switching circuit and said another switching circuit for inputting into said amplifying segment.

47. An apparatus for transmitting an input wave comprising:
   a signal generator for generating two or more digital signals that represent said input wave when combined;
   a signal modulator for modulating a carrier wave with a characteristic of at least one of said two or more digital signals to generate a modulated signal and for modulating a phase shifted carrier wave with a characteristic of another of said two or more digital signals to generate a phase shifted modulated signal;
   a comparator for comparing at least another characteristic of said two or more digital signals that represent said input wave when combined with said characteristic of another of said two or more digital signals to generate at least one digital control signal;
   an amplifier having at least one amplifying segment for receiving said modulated signal and said phase shifted modulated signal;
   a controller for controlling said at least one amplifying segment with said at least one digital control signal to generate at least one segment output; and
   an output circuit for transmitting an output signal based upon said at least one output segment.

48. The apparatus of claim 47, wherein said two or more digital signals comprise an in-phase and a quadrature signal.

49. The apparatus of claim 47, wherein said characteristic used to generate said control signal is magnitude.

50. The apparatus of claim 47, wherein said characteristic used to modulate said carrier wave is sign.

51. The apparatus of claim 47, wherein said carrier wave is an RF signal.

52. The apparatus of claim 47, wherein said segment is a power amplifier.

53. The apparatus of claim 47, wherein said segment is a current source.

54. A method for electromagnetic processing of an input wave comprising the steps of:
   receiving a modified signal derived from two or more signals that represent an input wave when combined; and
   regulating said modified signal via a plurality of segments using a comparison of at least one characteristic of one of said two or more signals with said at least one characteristic of another of said two or more signals, wherein one or more of the segments is independently controlled as a power amplifier by a portion of the two or more signals that represent the input wave to contribute power to an output signal.

55. The method of claim 54, wherein one or more of the segments is independently controlled as a current source by said portion of the two or more signals that represent the input wave to contribute current to an output signal.

* * * * *